(12) United States Patent
Choy

(10) Patent No.: US 6,327,169 B1
(45) Date of Patent: Dec. 4, 2001

(54) MULTIPLE BIT LINE MEMORY ARCHITECTURE

(75) Inventor: Wing Choy, San Francisco, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/702,384

(22) Filed: Oct. 31, 2000

(51) Int. Cl.[7] .................................................... G11C 5/02
(52) U.S. Cl. ................................................. 365/51; 365/63
(58) Field of Search .......................... 365/51, 63, 230.03, 365/205, 206, 207, 208

(56) References Cited

U.S. PATENT DOCUMENTS

| | | | | |
|---|---|---|---|---|
| 4,922,453 | * | 5/1990 | Hidaka ..................................... | 365/63 |
| 5,012,447 | * | 4/1991 | Matsuda et al. ...................... | 365/206 |
| 5,280,441 | * | 1/1994 | Qada et al. ............................ | 365/63 |
| 5,396,450 | * | 3/1995 | Takashima et al. ................... | 365/63 |
| 5,555,203 | * | 9/1996 | Shiratake et al. ...................... | 365/63 |
| 5,629,987 | * | 5/1997 | Nakano et al. ........................ | 365/63 |
| 5,761,109 | * | 6/1998 | Takashima et al. ................... | 365/63 |

* cited by examiner

*Primary Examiner*—Trong Phan

(57) ABSTRACT

A memory architecture which includes a plurality of memory cells arranged in rows and columns. A word line is connected to each row of memory cells, and a plurality of bit lines are connected to each column of memory cells. Providing that more than one bit line is connected to each column of memory cells improves the performance of large memories, provides reduced access times without having to increase the size of the memory, and provides that a large memory consumes less power. The bit lines may each be formed of the same material, or they may be formed of different material depending on the application. The memory cells may be disposed in a plurality of arrays, and the arrays may be symmetrical (i.e. where each array is the same size) or asymmetrical (i.e. where the arrays are not the same size).

18 Claims, 2 Drawing Sheets

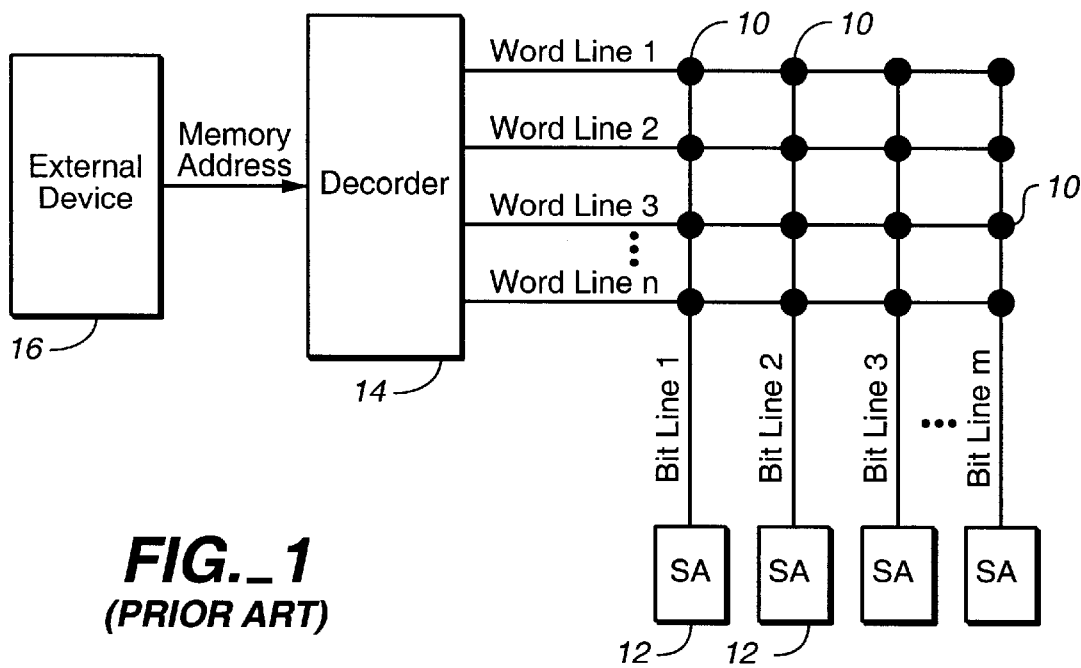
FIG._1
*(PRIOR ART)*
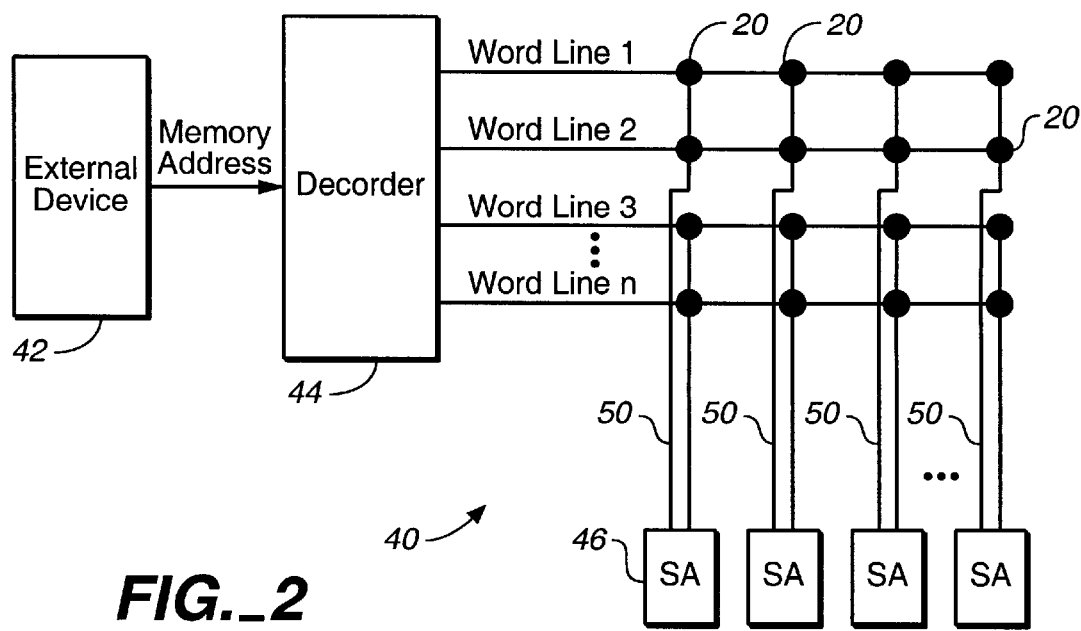
FIG._2

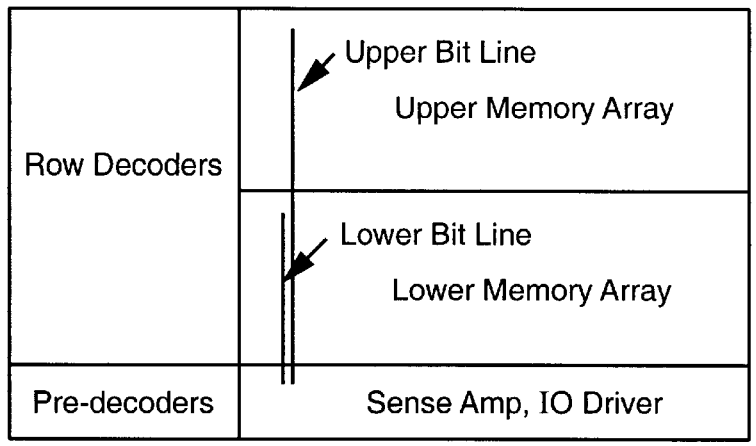
FIG._3
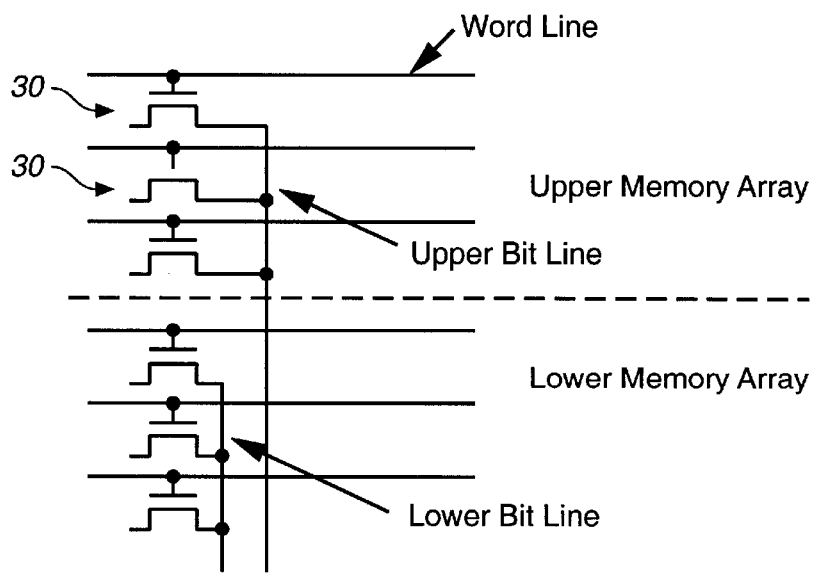
FIG._4
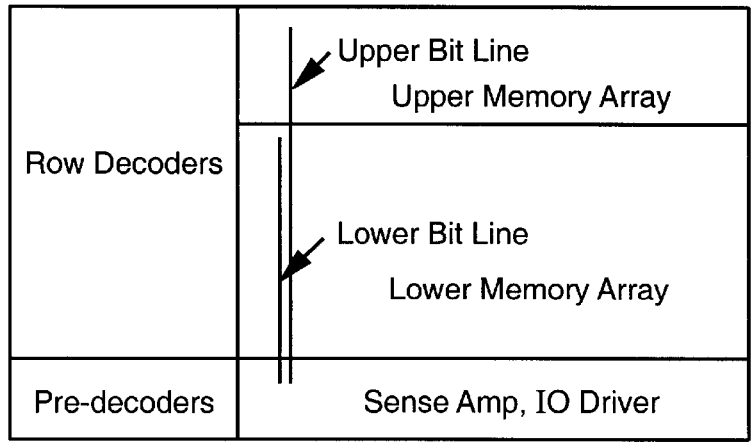
FIG._5

MULTIPLE BIT LINE MEMORY ARCHITECTURE

FIELD OF THE INVENTION

The present invention relates generally to memory architectures, and more specifically relates to a memory architecture which improves the performance of large memories.

BACKGROUND OF THE INVENTION

In a prior art memory architecture, memory cells are arranged in an array or matrix consisting of rows and columns. Each memory cell includes a pass transistor, and read/write word lines are connected to the pass transistors of the memory cells. Read/write bit lines are also connected to the memory cells, and the word lines are used to effectively connect the bit lines to the memory cells. Typically, the word lines are disposed horizontally through the rows of memory cells in the array, and the bit lines are disposed vertically through the columns of memory cells in the array. Each row of memory cells is connected to a single it word line, and each column of memory cells is connected to a single bit line. Therefore, each row of memory cells is associated with a different word line, and each column of memory cells is associated with a different bit line. Sense amplifiers are provided at the bottom of the array, and the bit lines are connected to the sense amplifiers.

This prior art arrangement is illustrated schematically in FIG. 1, wherein the dots 10 in the array represent memory cells, the horizontal lines represent word lines (wherein the array has n word lines), and the vertical lines represent bit lines (wherein the array has m word lines). As shown, each row of memory cells is associated with a different word line, and each column of memory cells is associated with a different bit line. Additionally, sense amplifiers 12 are provided at the bottom of the array, and each bit line is connected to a different sense amplifier. As shown, a decoder 14 is connected to the word lines, and an external device 16 is in communication with the decoder 14. In operation, the external device 16 supplies a memory address to the decoder 14, and the decoder 14 decodes the memory address and turns on a corresponding word line. The word line turns on pass transistors of the memory cells in the respective row of memory cells, and effectively connects the corresponding bit lines to the memory cells in the row.

The access time for a given memory cell is determined, at least in part, by how quickly the bit line which is connected to the memory cell is driven to the correct (i.e. threshold) voltage for the sense amplifier. Typically, the memory cells which are farthest from the sense amplifiers have the slowest access times due to loading on the bit lines.

To reduce access times, a prior art approach provides that a large memory array is effectively divided into a plurality of blocks. Such approach provides that each block has its own set of address decoders, sense amplifiers, column multiplexers (if the memory is implemented using multiple columns) and Input/Output (I/O) drivers, thus increasing the overall size of the memory.

OBJECTS AND SUMMARY

It is an object of an embodiment of the present invention to provide a memory architecture which improves the performance of large memories.

Another object of an embodiment of the present invention is to provide a memory architecture which provides reduced access times without having to increase the size of the memory.

Still another object of an embodiment of the present invention is to provide a memory architecture which provides that a large memory consumes less power.

Briefly, and in accordance with at least one of the foregoing objects, an embodiment of the present invention provides a memory architecture which includes a plurality of memory cells arranged in rows and columns, a word line connected to each row of memory cells, and a plurality of bit lines connected to each column of memory cells.

Providing that more than one bit line is connected to each column of memory cells improves the performance of large memories, provides reduced access times without having to increase the size of the memory, and provides that a large memory consumes less power.

Preferably, a sense amplifier is connected to the bit lines. The bit lines may each be formed of the same material, or they may be formed of different material depending on the application. The memory cells may be disposed in a plurality of arrays, and the arrays may be symmetrical (i.e. where each array is the same size) or asymmetrical (i.e. where the arrays are not the same size).

BRIEF DESCRIPTION OF THE DRAWINGS

The present invention and the advantages thereof will become more apparent upon consideration of the following detailed description when taken in conjunction with the accompanying drawings of which:

FIG. 1 is a schematic diagram illustrating a prior art memory architecture;

FIG. 2 is a schematic diagram illustrating a memory architecture which is in accordance with an embodiment of the present invention;

FIG. 3 is another schematic diagram of the memory architecture shown in FIG. 2;

FIG. 4 is yet another schematic diagram of the memory architecture shown in FIGS. 2 and 3, showing the connection of the word lines and bit lines to the memory cells; and FIG. 5 is a schematic diagram similar to FIG. 3, showing an alternative embodiment where the memory cells are arranged into two asymmetrical arrays.

DESCRIPTION

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

A memory architecture which is in accordance with an embodiment of the present invention is illustrated schematically in FIG. 2. Similar to FIG. 1, in FIG. 2, the dots 20 in the array represent memory cells, the horizontal lines represent word lines, and the vertical lines represent bit lines. As shown, each row of memory cells is associated with a different word line. However, each column of memory cells is associated with more than one bit line. While FIG. 2 shows a design where a pair of bit lines are associated with each column of memory cells, the invention contemplates possibly providing that more than two bit lines are associated with each column of memory cells. Regardless, providing that more than one bit line is connected to each column of memory cells improves performance, provides reduced access times, and provides that less power is consumed.

FIG. 3 is similar to FIG. 2, showing a pair of bit lines associated with each column of memory cells, but more clearly shows that the memory cells are divided into two arrays—an upper memory array and a lower memory array. Sense amplifiers and I/O drivers are disposed under the arrays, and each pair of bit lines is connected to a corresponding sense amplifier and I/O driver. As shown, the arrangement also provides that there are row decoders as well as pre-decoders. FIG. 3 shows how a reduction in loading is achieved—by providing that for each pair of bit lines, one bit line ("upper bit line") is connected to the upper memory array and the other bit line ("lower bit line") is connected to the lower memory array. Specifically, the upper bit line of each pair of bit lines is connected to the portion of the column of the memory cells which is in the upper memory array, and the lower bit line of each pair of bit lines is connected to the portion of the column of the memory cells which is in the lower memory array. While FIG. 3 shows only one pair of bit lines, preferably a pair of bit lines is provided for each column of memory cells in the architecture. By providing that a separate bit line is connected to each of the memory arrays, access times are reduced. This is especially important for those memory cells which are the top portion of the upper memory array. As described above, the access time for a given memory cell is determined, at least in part, by how quickly the bit line which is connected to the memory cell is driven to the correct (i.e. threshold) voltage for the sense amplifier. Typically, the memory cells which are farthest from the sense amplifiers have the slowest access times due to loading on the bit lines. The arrangement shown in FIG. 3 provides that there is less capacitive loading on each of the bit lines because each bit line is connected to less than all the memory cells in a given column.

FIG. 4 is another schematic illustration of the memory architecture shown in FIGS. 2 and 3. FIG. 4 shows the pass transistor 30 for each memory cell in the first column of the architecture, and shows the connection of each of the word lines and bit lines to the memory cells. As shown, while one bit line services a top portion of the column of memory cells, another bit line services a lower portion of the column. Of course, this structure is preferably repeated laterally, ie. for each of the other columns in the architecture.

The bit lines connected to the memory cells in each of the upper and lower memory arrays may be formed of different material. The bit lines which are connected to the memory cells in the upper memory array may also be sized differently than the bit lines which are connected to the memory cells in the lower memory array, for example, in order to reduce the resistance.

With reference to FIG. 2, in operation, when the memory 40 is being accessed, an external device 42 supplies a memory address which is decoded by a decoder 44. After the address is decoded, one of the word lines is turned on, and the data is either written into or read from the memory. As discussed above, the access time of a memory is partly determined by how fast the bit lines are driven to the correct voltage level for the sense amplifier 46. Since the loading of the bit lines 50 associated with the upper memory array is reduced, the time taken for the (otherwise) worst case memory cell (the memory cell which is farthest from the sense amplifier) to set the corresponding bit line to the correct level for sensing is reduced. Therefore, the performance of the memory is improved as a result of the multiple bit line-per-column arrangement. Another benefit of the architecture is the reduction of power consumption because less load needed to drive the memory.

Although FIGS. 2–4 show a design where the memory cells are divided into two symmetrical arrays—an upper memory array and a lower memory array of equal size, as shown in FIG. 5, it is possible to provide a design where the memory cells are divided into two asymmetrical arrays—an upper memory array and a lower memory array of unequal size. The configuration shown in FIG. 5, wherein the upper memory array is smaller than the lower memory array further reduces the transistor loading on the bit lines which are connected to the memory cells in the upper memory array (i.e. the "upper bit line"). Of course, still other designs are possible. For example, a design can be provided wherein memory cells are divided into four arrays, and four bit lines are connected to each column of memory cells in the architecture.

Regardless of which arrangement is ultimately implemented, providing that more than one bit line is connected to each column of memory cells improves the performance of large memories, provides reduced access times without having to increase the size of the memory, and provides that a large memory consumes less power.

While embodiments of the present invention are shown and described, it is envisioned that those skilled in the art may devise various modifications of the present invention without departing from the spirit and scope of the appended claims.

What is claimed is:

1. A memory architecture comprising:
    a plurality of memory cells arranged in rows and columns;
    a word line connected to each row of memory cells; and
    a plurality of bit lines connected to each column of memory cells, wherein each one of said plurality of bit lines is separate and distinct from each other and the bit lines are not conductively interconnected.

2. A memory architecture as recited in claim 1, further comprising a sense amplifier connected to each one of said plurality of bit lines.

3. A memory architecture as recited in claim 1, wherein said plurality of bit lines comprises a first bit line connected to a first column of memory cells and a second bit line connected to said first column of memory cells.

4. A memory architecture as recited in claim 3, wherein said first bit line is formed of a first material and said second bit line is formed of a second material, and said first material is different from said second material.

5. A memory architecture as recited in claim 1, wherein each memory cell includes a pass transistor.

6. A memory architecture as recited in claim 1, wherein said memory cells are arranged in a plurality of arrays.

7. A memory architecture as recited in claim 6, wherein said plurality of bit lines comprises a first bit line connected to a first portion of a first column of memory cells and a second bit line connected to a second portion of said first column of memory cells.

8. A memory architecture as recited in claim 7, wherein said first portion is disposed in a first memory array and said second portion is disposed in a second memory array, wherein said first memory array is of a different size than is said second memory array.

9. A memory architecture comprising:
    a plurality of memory cells arranged in rows and columns;
    a plurality of word lines, wherein each word line is connected to one of the rows of memory cells; and
    a plurality of bit lines connected to one of the columns of memory cells, wherein each one of said plurality of bit lines is separate and distinct from each other and the bit lines are not conductively interconnected.

10. A memory architecture as recited in claim 9, further comprising a sense amplifier connected to each one of said plurality of bit lines.

11. A memory architecture as recited in claim 9, wherein said plurality of bit lines comprises a first bit line connected to a first column of memory cells and a second bit line connected to said first column of memory cells.

12. A memory architecture as recited in claim 11, wherein said first bit line is formed of a first material and said second bit line is formed of a second material, and said first material is different from said second material.

13. A memory architecture as recited in claim 9, wherein each memory cell includes a pass transistor.

14. A memory architecture as recited in claim 9, wherein said memory cells are arranged in a plurality of arrays.

15. A memory architecture as recited in claim 14, wherein said plurality of bit lines comprises a first bit line connected to a first portion of a first column of memory cells and a second bit line connected to a second portion of said first column of memory cells.

16. A memory architecture as recited in claim 15, wherein said first portion is disposed in a first memory array and said second portion is disposed in a second memory array, wherein said first memory array is of a different size than is said second memory array.

17. A memory architecture comprising:

a plurality of memory cells arranged in rows and columns;

a word line connected to one of the rows of memory cells; and at least two bit lines connected to one of the columns of memory cells, wherein each one of said at least two bit lines is separate and distinct from each other and the bit lines are not conductively interconnected.

18. A memory architecture as recited in claim 17, further comprising a sense amplifier connected to each one of said at least two bit lines.

* * * * *